Jan. 27, 1970 H. KORN 3,492,514

VOLTAGE VARIABLE CAPACITANCE RANGE EXTENDER

Filed April 17, 1967

INVENTOR
HUGO KORN

BY

Mueller, Aichele & Rauner

ATTYS.

United States Patent Office 3,492,514
Patented Jan. 27, 1970

3,492,514
VOLTAGE VARIABLE CAPACITANCE RANGE EXTENDER

Hugo Korn, Chicago, Ill., assignor to Motorola, Inc., Franklin Park, Ill., a corporation of Illinois
Filed Apr. 17, 1967, Ser. No. 631,484
Int. Cl. H03k 3/26; H03j 3/06
U.S. Cl. 307—320 7 Claims

ABSTRACT OF THE DISCLOSURE

A circuit including multiple voltage variable capacitance diodes individually biased by separate voltage divider networks, with the first bias network providing a variable bias and the other networks providing fixed levels. A diode switch is connected between adjacent capacitance diodes for connecting the capacitance diodes in parallel in response to the voltage difference between the adjacent capacitance diodes. As the variable bias is decreased the capacitance of the diodes increases and additional capacitance diodes are sequentially added to increase the output circuit capacitance.

BACKGROUND OF THE INVENTION

With the development of voltage-variable capacitance diodes many applications have been found where the diodes can replace variable capacitors of other types. This is commercially advantageous because of the fact that these diodes are more compact and less expensive than mechanically variable capacitors. However, due to the limited capacitance range of commercially available diodes, the application has been restricted to circuitry which do not require a large capacitance range. At the higher frequency ranges this limitation is not critical in producing large frequency tuning variations. At the lower frequency ranges, however, this limitation becomes critical and therefore prevents the utilization of these diodes in tuning circuits which require a large capacitance range.

SUMMARY OF THE INVENTION

An object of this invention is to provide a compact and economical voltage variable capacitance diode circuit which can be used to extend the capacitance range beyond what is available with the use of only one voltage variable capacitance diode.

Another object of this invention is to provide a voltage variable capacitance diode circuit which can be used in a radio tuning circuit to provide sufficient capacitance range to tune across a desired band.

In one embodiment of the invention the circuit consists of multiple voltage variable capacitance diodes with a diode switch connected between adjacent capacitance diodes. Separate bias networks consisting of tapped voltage dividers provide a predetermined bias level for each capacitance diode, with the first bias network being variable. Each diode switch is reversed biased by the difference in potential across adjacent capacitance diodes whenever the voltage across the preceding diode exceeds that across the following diode. A decrease of the first bias level on the first capacitance diode not only changes the capacitance of the first capacitance diode but also sequentially adds additional capacitance diodes to the output capacitance as each of the switching diodes is changed from a reverse to a forward bias condition.

DETAILED DESCRIPTION

Figure 1:
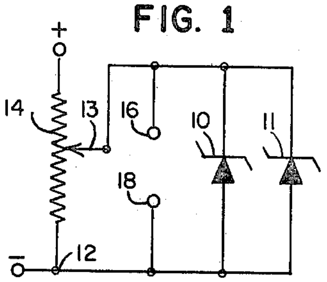
FIG. 1 is a schematic circuit diagram illustrating the prior art.

Referring now to FIG. 1, a circuit is shown which utilizes two parallel connected voltage variable capacitance diode devices 10 and 11 connected between terminal 12 and movable arm or contact 13 of potentiometer 14. Potentiometer 14, connected across the potential supply, supplies a positive bias potential through movable arm 13 to the diodes 10 and 11 in order to vary the capacitance of the diodes 10 and 11. The output capacitance of the circuit is taken from terminals 16 and 18, which are connected across diodes 10 and 11.

Figure 3:
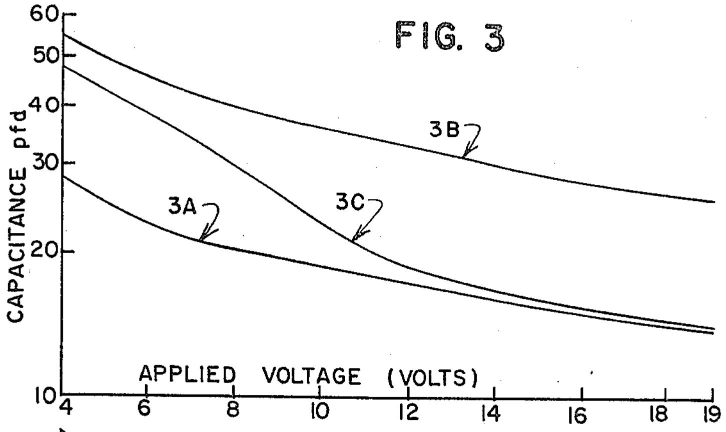
FIG. 3 illustrates the capacitance vs. voltage characteristic of the circuits of FIGS. 1 and 2.

As movable arm 13 is moved toward terminal 12 the reverse bias on the diodes 10 and 11 decreases thereby causing an increase in the capacitance as seen at output terminals 16 and 18. If capacitance diode 11 were omitted from the circuit, the circuit would respond to the variation in the bias voltage as shown in FIG. 3A. FIG. 3A shows that with a change in the bias voltage from 19 volts to 4 volts the output capacitance as seen at terminals 16 and 18 will increase from 14 to 28 picofarads, which is a capacitance variation ratio of 2:1.

FIG. 3B shows the response of the circuit with diodes 10 and 11 connected in parallel. A change in bias voltage from 19 volts to 4 volts will produce a change in the output capacitance from 27 to 55 picofarads, which is a capacitance variation ratio of approximately 2:1. It is therefore apparent that the capacitance variation ratio is the same regardless of whether the circuit utilizes a single diode or uses two diodes in parallel.

Figure 2:
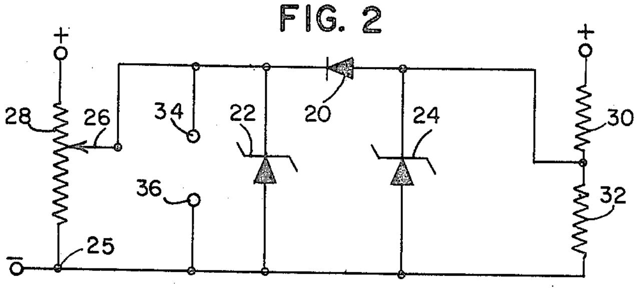
FIG. 2 is a schematic circuit diagram of the circuit of the invention.

In the circuit of the invention as illustrated in FIG. 2, a greater capacitance variation ratio can be achieved than that shown in the circuit of FIG. 1. Diode switch 20 is connected between the cathodes of capacitance diodes 22 and 24 in order to isolate capacitance diode 24 from the output terminals until diode switch 20 becomes forward biased. Each of the capacitance diodes 22 and 24 has a separate bias network. Capacitance diode 22 is connected between terminal 25 and movable arm 26 of variable bias network or potentiometer 28, which is connected across the positive potential supply. The bias network for capacitance diode 24 is formed by serially connected resistors 30 and 32 which are connected across the positive potential supply. A tap on the biasing network is connected to the junction of the cathode of capacitance diode 24 and the anode of diode switch 20 in order to provide a fixed predetermined bias voltage to diode 24. The output capacitance of the circuit is taken from terminals 34 and 36, which are connected across diode 22.

When movable arm 26 of potentiometer 28 is at its maximum positive potential, diode 22 has minimum capacitance and diode switch 20 is reversed biased. As movable arm 26 of potentiometer 28 is moved toward terminal 25 the capacitance of diode 22 increases thereby increasing the output capacitance as seen at terminals 34 and 36. In addition, the positive potential on the cathode of diode switch 20 decreases, thereby decreasing the reverse bias on switch 20. When movable arm 26 is moved sufficiently toward terminal 25, a point is reached at which diode switch 20 changes from a reverse to a forward biased condition. At this time the diode switch will conduct and capacitance diode 24 along with its associated bias network will be effectively placed across the output terminals 34 and 36. The output capacitances then will be equal to the sum of the capacitances of diodes 22 and 24. Further movement of movable arm 26 toward terminal 25 will decrease the bias on diode 22 as well as that of diode 24 to further increase the parallel capacitance of diodes 22 and 24 as seen at terminals 34 and 36.

As shown in FIG. 3C the circuit will function as a single capacitance diode until the diode switch 20 is changed from a reverse bias to a forward bias condition. At this time the circuit will function as two capacitances in parallel to increase the capacitance at the output terminals. FIG. 3C reveals how a change in the bias voltage is applied across capacitance diode 22 from 19 volts to 4 volts will produce a capacitance variation, as seen at output terminals 34 and 36, of from 14 to 48 picofarads, which is a capacitance variation ratio of more than 3.4 to 1. With this relatively large range of capacitance variation the circuit of FIG. 2 is readily adaptable for use in many applications in lieu of the mechanically variable capacitors. The circuit of FIG. 2 is also sufficiently compact and economical to make it practical for use in many applications. Basically it can be used in any application requiring a capacitance range beyond that available with only one capacitance diode.

Figure 4:
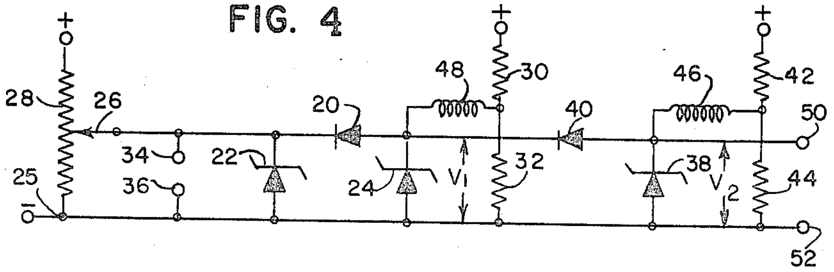
FIG. 4 is a schematic circuit diagram of a modification of the circuit of FIG. 2.

The circuit of FIG. 4 is a modification of the circuit of FIG. 2 and shows how additional capacitance diodes, with their respective associated biasing networks, can be added to obtain a still greater capacitance range. Similar circuit components are given the same reference numbers as those shown in the circuit of FIG. 2. An additional capacitance diode device 38 is connected to terminal 25 in order to further extend the capacitance range of the circuit. Diode switch 40 is connected between the cathodes of capacitance diodes 24 and 38 in order to isolate capacitance diode 38 from the output terminals until the bias on movable arm 26 of potentiometer 28 has decreased sufficiently to forward bias diode switch 40. A fixed voltage divider network formed by serially connected resistors 42 and 44 is connected across the positive source of potential. A tap at the junction of resistors 42 and 44 is connected through inductor 46 to the cathode of diode 38 in order to provide a predetermined voltage level for reverse biasing capacitance diode 38. This tap provides a lower voltage than that provided at the junction of resistors 30 and 32 to reverse bias diode switch 40.

The tap at the junction of resistors 30 and 32 is connected through inductor 48 to the cathode of diode 24 to perform a like function for capacitance diode 24 and diode switch 20. Inductors 46 and 48 isolate the fixed bias networks from high frequency signals which may be applied to output terminals 34 and 36, such as the broadcast band frequencies. Terminals 50 and 52 are provided for adding additional capacitance diode elements or devices.

With the movable arm 26 of potentiometer 28 at the positive potential, diode switches 20 and 40 are reversed biased by the predetermined voltage levels determined from their respective voltage divider bias networks. As movable arm 26 is moved toward terminal 25 the capacitance of capacitance diode 22 increases. As the arm continues to be moved toward terminal 25 diode switch 20 changes from a reverse to a forward biased condition due to the fact that the voltage drop across capacitance diode 22 is smaller than that across capacitance diode 24. At this time diode switch 20 conducts and places capacitance diode 24 in parallel with capacitance diode 22. Since diode switch 40 is still reversed biased at this time, capacitance diode 38 is effectively disconnected from the output terminals 34 and 36. The output capacitance as seen at output terminals 34 and 36 is composed of the parallel capacitances of diodes 22 and 24 and continues to increase as movable arm 26 is moved toward terminal 25, since the voltage applied across capacitance diodes 22 and 24 decreases. When the voltage applied to capacitance diodes 22 and 24 has decreased to a value less than the voltage across capacitance diode 38, diode switch 40 changes from a reverse to a forward bias condition and conducts. Capacitance diode 38 is then effectively placed in parallel with capacitance diodes 22 and 24 and the output capacity as seen at output terminals 34 and 36 is composed of the parallel capacitances of diodes 22, 24 and 38.

Figure 5:
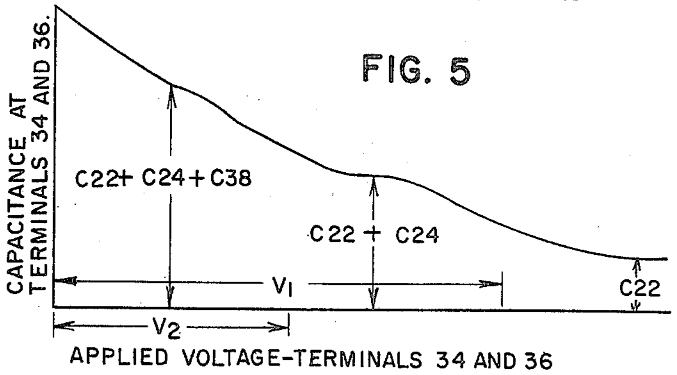
FIG. 5 illustrates the range of the output capacitance of the circuit of FIG. 4 as a function of the applied voltage.

FIG. 5 shows the operation of the circuit of FIG. 4, and it is apparent that the output capacitance increases as the voltage drops, with significant increase in value as each additional capacitance diode is switched into the circuit. The overall capacitance ranges from the small capacitance of capacitance diode 22 when movable arm 26 of potentiometer 28 is at the maximum positive potential, to the capacitance of all three parallel connected capacitance diodes when the movable arm 26 approaches the point 25 and the applied voltage has been sufficiently reduced to forward bias diode switches 20 and 40 and increase the capacitance values of the diodes. This arrangement permits sufficient variation in output capacitance for tuning of the resonant circuits of a radio receiver through the entire AM broadcast band.

Applicant has provided a compact and economical voltage variable capacitance diode circuit which extends the capacitance range of capacitance diodes. By using additional voltage variable capacitance diodes, with voltage dividers to provide reverse bias therefor and isolating diodes therebetween, a very large range of capacitance can be obtained.

I claim:

1. A voltage variable capacitance range extender circuit including in combination, a plurality of voltage variable capacitance devices, each of said devices having an associated reverse bias means connected thereto in order to control the capacitance thereof, said bias means of one of said devices being variable in order to vary the capacitance of said one device over a predetermined range, and semiconductor switch means connected between adjacent devices and responsive to the potential difference between said adjacent devices for conduction and non-conduction conditions, said switch means being responsive to a predetermined level in bias from said variable bias means to change from the non-conduction to the conduction condition to effectively connect said adjacent devices in parallel thereby changing the total capacitance.

2. The voltage variable capacitance range extender circuit of claim 1 wherein said semiconductor switch means includes a switching diode, and said voltage variable capacitance devices are voltage variable capacitance diodes which are connected in parallel upon the conduction of said switching diode.

3. The voltage variable capacitance range extender circuit of claim 1 wherein said variable bias means includes a potentiometer having a movable contact connected to said first device and the other of said bias means includes a voltage divider network having a tap coupled to its associated device.

4. The voltage variable capacitance range extender circuit of claim 1 wherein said plurality of voltage variable capacitance devices consists of first and second devices.

5. The voltage variable capacitance range extender circuit of claim 1 wherein said plurality of voltage variable capacitance devices includes first, second and third devices.

6. A voltage variable capacitance range extender circuit including in combination, first and second voltage variable capacitance devices, said first device having a pair of capacitance output terminals connected thereacross, first and second bias means coupled to said first and second devices respectively to provide reverse biases thereto, said first bias means being variable to vary the capacitance of said first device, and diode means connected between said first and second devices and responsive and responsive to a potential difference therebetween to change from a non-conductive to a conductive condition whereupon said second device is connected to said output terminals in response to a predetermined bias at said first bias means and the capacitance thereof is added to the capacitance of said first device to increase the total capacitance range.

7. The voltage variable capacitance range extender circuit of claim 6 further including a third voltage variable capacitance device having a third bias means coupled thereto and second diode means connected between said second and third devices and responsive to a potential difference therebetween to change from a non-conductive to a conductive condition in response to a predetermined bias at said second device, whereupon said third device is connected to said output terminals and the capacitance thereof is added to the capacitances of said first and second devices to further increase the total capacitance range.

References Cited

UNITED STATES PATENTS 3,167,730 1/1965 Anderson et al. ------ 334—15

DONALD D. FORRER, Primary Examiner

U.S. Cl. X.R.

334—15